US010976792B2

(12) United States Patent
Brooks et al.

(10) Patent No.: US 10,976,792 B2
(45) Date of Patent: Apr. 13, 2021

(54) INPUT POWER SCALING OF POWER SUPPLY DEVICES

(71) Applicant: HEWLETT-PACKARD DEVELOPMENT COMPANY, L.P., Houston, TX (US)

(72) Inventors: Robert C. Brooks, Houston, TX (US); Michael R. Durham, Houston, TX (US); Christopher Woodbury, Houston, TX (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 403 days.

(21) Appl. No.: 16/083,109

(22) PCT Filed: Apr. 14, 2017

(86) PCT No.: PCT/US2017/027711
§ 371 (c)(1),
(2) Date: Sep. 7, 2018

(87) PCT Pub. No.: WO2018/190873
PCT Pub. Date: Oct. 18, 2018

(65) Prior Publication Data
US 2020/0301494 A1  Sep. 24, 2020

(51) Int. Cl.
*G06F 1/28* (2006.01)
*G01R 21/00* (2006.01)
(52) U.S. Cl.
CPC ............... *G06F 1/28* (2013.01); *G01R 21/00* (2013.01)

(58) Field of Classification Search
CPC . G06F 1/26; G06F 1/28; G01R 21/00; H02M 1/10
See application file for complete search history.

(56) References Cited

U.S. PATENT DOCUMENTS

| 6,459,175 B1 | 10/2002 | Potega |
| 7,173,408 B2 | 2/2007 | Huang |

(Continued)

FOREIGN PATENT DOCUMENTS

| CN | 105738689 | 7/2016 |
| CN | 105759114 | 7/2016 |

(Continued)

OTHER PUBLICATIONS

"AD5292 Digital Potentiometer", Retrieved form internet—https://www.digikey.com/en/product-highlight/a/analog-devices/ad5292-digital-potentiometer, Jul. 17, 2012, 2 Pages.

*Primary Examiner* — Terrell S Johnson
(74) *Attorney, Agent, or Firm* — Fabian VanCott

(57) ABSTRACT

In one example in accordance with the present disclosure, a power management device is described. The power monitoring device includes an input line to receive input power information from a power supply device. The input power information is indicative of a level of input power from the power supply device. A controller of the power monitoring device determines a scaling amount of the input power information based on a power rating of the power supply device. A programmable scaling device scales the input power information based on the scaling amount to generate output information and an output line passes the output information to a set of recipient devices.

15 Claims, 5 Drawing Sheets

(56) References Cited

U.S. PATENT DOCUMENTS

| | | |
|---|---|---|
| 9,413,219 B2 | 8/2016 | Jang |
| 9,563,216 B1 | 2/2017 | Barroso et al. |
| 2005/0177771 A1 | 8/2005 | Miller |
| 2008/0195779 A1 | 8/2008 | Hawthorne et al. |
| 2011/0316521 A1* | 12/2011 | Brooks .................. G06F 1/266 |
| | | 323/364 |
| 2013/0127439 A1 | 5/2013 | Fu et al. |
| 2015/0035564 A1 | 2/2015 | Tobin |
| 2015/0123639 A1 | 5/2015 | Jang |
| 2016/0048150 A1 | 2/2016 | Chiang et al. |
| 2016/0054745 A1* | 2/2016 | Sawyers .................. G05F 1/46 |
| | | 324/71.1 |
| 2016/0147243 A1 | 5/2016 | Micali et al. |

FOREIGN PATENT DOCUMENTS

| | | |
|---|---|---|
| EP | 2492694 | 8/2012 |
| EP | 2965416 | 1/2016 |
| RU | 2550360 C1 | 5/2015 |

* cited by examiner

INPUT POWER SCALING OF POWER SUPPLY DEVICES

BACKGROUND

Computing devices are made up of multiple, and various, components. Examples of these components include processors, memory units, and input/output devices. Each of these devices consume power, which power is supplied by a power supply device of the computing device. As computing devices become more powerful, they consume more power.

BRIEF DESCRIPTION OF THE DRAWINGS

The accompanying drawings illustrate various examples of the principles described herein and are part of the specification. The illustrated examples are given merely for illustration, and do not limit the scope of the claims.

Figure 1:
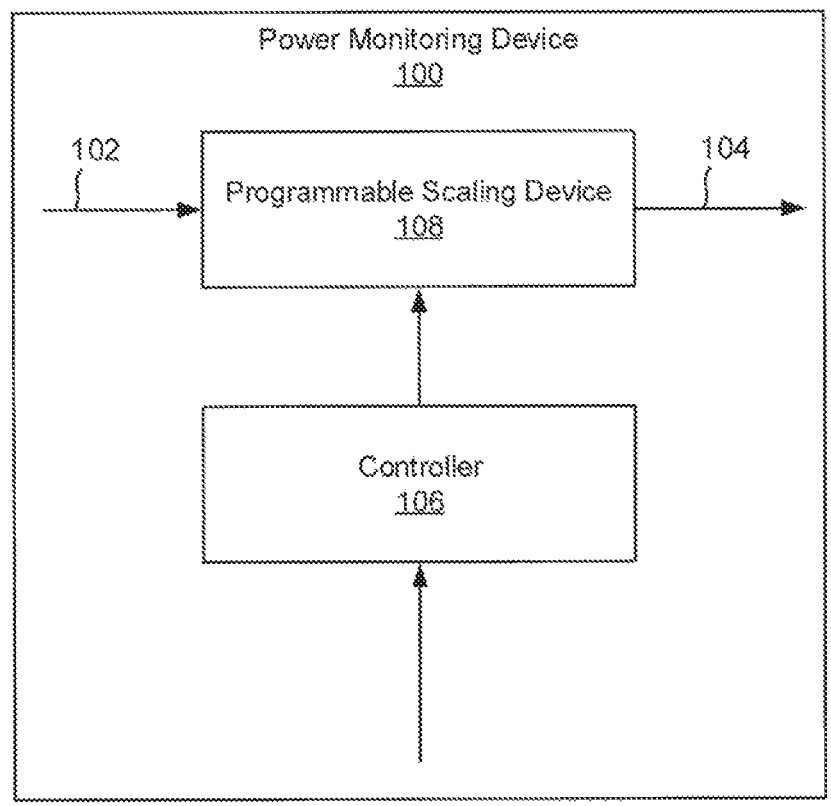
FIG. 1 is a block diagram of a device for input power scaling of power supply devices, according to an example of the principles described herein.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

Computing devices are made up of multiple, and various, components. Examples of these components include processors, memory units, and input/output devices. Each of these devices consume power, which power is supplied by a power supply device of the computing device. As computing devices become more powerful, they consume more power; power that may not be sufficiently supplied by a smaller power supply device. However, simply adding a larger power supply device may be undesirable. For example, larger power supplies take up more space, are heavier, and are more costly to implement. Power management systems can allow for more efficient use of power supplies. The present specification describes a portion of a larger power management system. This portion provides a flexible manner to monitor the power supplied to the computing device.

Specifically, the present specification describes a system that 1) determines a rating for a power supply device that provides an input power. Based on the rating, a programmable scaling device of the system scales input power information. The input power information is scaled such that when the power supply is delivering its rated power, the output of the programmable scaling device is a predetermined value. For example, assume the predetermined value is 2 volts (V). Accordingly, the scale is such that were the power supply device to be operating at its rated power, the output voltage would be 2V. However, if the power supply device were operating at 50% its rated power, the output voltage would be 1V.

This can be performed for different power supply devices that are coupled to the system and is compatible with a plurality of power supply device ratings. That is, over time old power supply devices may be swapped out for new power supply devices. Sometimes the new power supply device may have a different rating. This one power monitoring device can be used to scale information on input power from power supply devices having any rating. That is, by using the present system, there is no limitation regarding a rating of a power supply device that may supply power to an associated computing device.

Specifically, in one example this can be done by implementing a programmable potentiometer as a resistance device of a voltage divider. A signal is received by a controller of the power monitoring device, which signal indicates a rating of the power supply device coupled to the power monitoring device. From a mapping, a resistance value for the programmable potentiometer is calculated. This mapping may be a linear scale such that a predetermined voltage is output when the power supply device is delivering its rated power. This output voltage can then be passed onto other components of the system to further monitor system power requirements or control power to the system. For example, the other components can control power when an output voltage is above a threshold amount for longer than a predetermined period of time.

Specifically, the present specification describes a power monitoring device. The power monitoring device includes an input line to receive input power information from a power supply device. The input power information is indicative of a level of input power from the power supply device. A controller of the computing device determines a scaling amount for the input power information based on a power rating of the power supply device. A programmable scaling device of the computing device scales the input power information based on the scaling amount to generate output information that is a scaled representation of the input power information, which output information is passed to a set of recipient devices.

The present specification also describes a method for scaling input power for power supply devices. According to the method, a level of input power supplied by a power supply device is monitored. Based on a power rating of the power supply device, a scaling amount is determined. The scaling amount determines how much to scale the input power information to be supplied as output information. The input power information is indicative of the level of input power. Accordingly, the input power information is scaled based on a determined scaling amount, and output information passed, which output information is a scaled representation of the input power information. Such scaling can be carried out by programming a variable resistance device that forms a second resistance device, e.g., a potentiometer, of a voltage divider. A first resistance device of the voltage divider has a fixed resistance.

The present specification also describes a computing system. The computing system includes a processor and a machine-readable storage medium coupled to the processor. An instruction set stored in the machine-readable storage medium is executed by the processor. The instruction set includes instructions to monitor a level of input power supplied by a power supply device; determine, based on a power rating of the power supply device, a scaling amount of input power information, the scaled amount to be supplied as output information which is a scaled representation of the input power information, and to set a variable resistance device that forms a second resistance device, e.g., a potentiometer, of a voltage divider based on the scaling amount. A first resistance device of the voltage divider has a fixed resistance.

In summary, using such a power monitoring device 1) increases flexibility of the monitoring system by accommodating power supply devices having any rating; 2) accounts for the swapping of power supply devices; 3) reduces part count on a circuit; and 4) reduces circuit complexity. However, it is contemplated that the devices disclosed herein may address other matters and deficiencies in a plurality of technical areas.

As used in the present specification and in the appended claims, the term "power rating" refers to a highest amount of power that a power supply device can safely provide, without risk to overheating or otherwise damaging the power supply device.

Turning now to the figures, FIG. 1 is a block diagram of a power monitoring device 100 for input power scaling of power supply devices, according to an example of the principles described herein. The power monitoring device 100 may be included in a computing device. Examples of such computing devices include desktop computers, laptop computers, tablets, and personal digital assistants, among others.

The power monitoring device 100 includes an input line 102, through which input power information is supplied to the power monitoring device 100 components. That is, a power supply device is coupled to the input line 102 and input power information is passed thereon. In some examples, the input power information may be a voltage value that is indicative of the input power. The input power voltage value may be an unsealed representation of the input power.

As used in the present specification and appended claims, the term power supply device refers to a device that provides power to a computing device. Examples of power supply devices include an Advanced Technology Extended (ATX) unit, an ATX12V unit, 19V source from an Adapter (ADP) port and a power supply device connected to a Universal Serial Bus, Type-C (USB-C) port. Each power supply device has a power rating which indicates the amount of power that it can safely provide without overheating or otherwise failing.

The power monitoring device 100 also includes an output line 104 to generate output information to a set of recipient devices, which output information has been scaled with respect to the input power information. The output information may be a scaled representation of the input power information, and similarly may be a voltage value.

The output information may be passed to recipient devices that monitor or control the system's power demand of the power supply devices. As a specific example, a recipient device may be a voltage regulator (VR) controller, which communicates the system power demand to the central processing unit (CPU). Another example of a recipient device is a super input/output (SIO) device, which controls system power demand based on the system's average power over pre-defined time intervals. In other words, the recipient devices to which the output information is supplied may be system power monitoring or controlling devices. In some examples, the set of recipient devices may include a single device or may include multiple devices. For example, the output information could be passed to just a VR controller or may be sent to both a VR controller and a SIO device.

It may be desirable to scale the input power information down to a particular scale of outputs. For example, the recipient devices to which the output information is sent may 1) monitor the power supply devices and 2) operate within a certain range. Accordingly, the output information, e.g., an output voltage, may indicate the input power, and the scaling of such an output information places the output information in a range acceptable to the devices to which it is sent.

Accordingly, the power supply devices are coupled to the power monitoring device 100 in order to provide an output that is 1) indicative of the input power and 2) that is scaled to be within a predetermined range. Accordingly, the power monitoring device 100 includes a controller 106 to determine an amount by which input power information is to be scaled and a programmable scaling device 108 to actually scale the input power information.

Specifically, the controller 106 receives an indication of a power rating for the power supply device that is presently coupled to the power monitoring device 100. As described above, the power rating of a power supply device refers to an amount of power that can safely be provided by the power supply device without risk of overheating or otherwise causing the power supply device to fail. Some power supply devices have a higher rating than others do; that is, they safely provide a higher power level than others. From this rating, the controller 106 determines an amount to scale input power information. The scale by which the input power information is reduced is such that an output from the power scaling device (108) is a predefined value when the power supply device is operating at its rated power. For example, a power supply device rated at 90 W may result in a 2 V output voltage when providing 90 W of power. If the 90 W power supply device is supplying 45 W of power, the output voltage may be 1 V. In other words, the controller 106 determines a scale that applies to the power supply device based on its rating, and scales the input power information according to that scale.

Using such a device that relies on the determined rating accounts for more than a few predetermined power supply devices. For example, the power monitoring device 100 of the present specification can accommodate unanticipated power supply devices.

Again, this scaling amount is dependent upon the power rating of the power supply device, with larger power supply devices, or power supply devices with a higher rating, being reduced according to a different scale as compared to power supply devices with a lower rating.

The power monitoring device 100 also includes a programmable scaling device 108 that scales the input power information based on the scaling amount. For example, after a controller 106 determines the relationship between input power information and a desired output range for a particular power supply device based on its rating, the programmable scaling device 108 operates to scale the input power information accordingly.

In one specific example, the programmable scaling device 108 includes a current-to-voltage converter to convert the input power information from current to voltage. The programmable scaling device 108 also includes a voltage divider with a fixed first resistance device above the output line 104 and a variable second resistance device, e.g., a potentiometer, below the output line 104. The scaling occurs as the variable second resistance device, which may be potentiometer, is set to a resistance value calculated as a function of the power supply device coupled to the system. The resistance of this second resistance device, e.g., the potentiometer, affects the information output along the output line 104. Accordingly, by changing the programmable potentiometer, an output is generated based on the identified relationship.

In some examples, the power monitoring device 100 can accommodate different power supply devices at different points in time. While at any given moment, one power supply device may be supplying power, the power supply device may be swappable. The different power supply devices may have a different rating and therefore may have a different mapping with regards to an output. For example, a linear relationship between rated input power and the predefined output value differs based on the rating of the power supply device. However, the present power monitoring device 100 is not tailored to any one, or few, ratings of power supply devices. That is, a wide variety of power supply devices with different ratings can be coupled to the computing device at any time, and the power monitoring device 100 can accurately output information within a desired range that is indicative of the power being supplied by that power supply device. Put another way, when the programmable scaling device 108 includes a variable resistance device, such as a potentiometer in a voltage divider, the potentiometer can be set to a plurality of values. Specifically, the potentiometer may be programmable to at least 256 different resistance values, thus accommodating a wide variety of power supply device ratings. Moreover, the power monitoring device 100, by basing scaling on ratings of the different power supply devices, can update the scaling when a new power supply device is added to the system.

Figure 2:
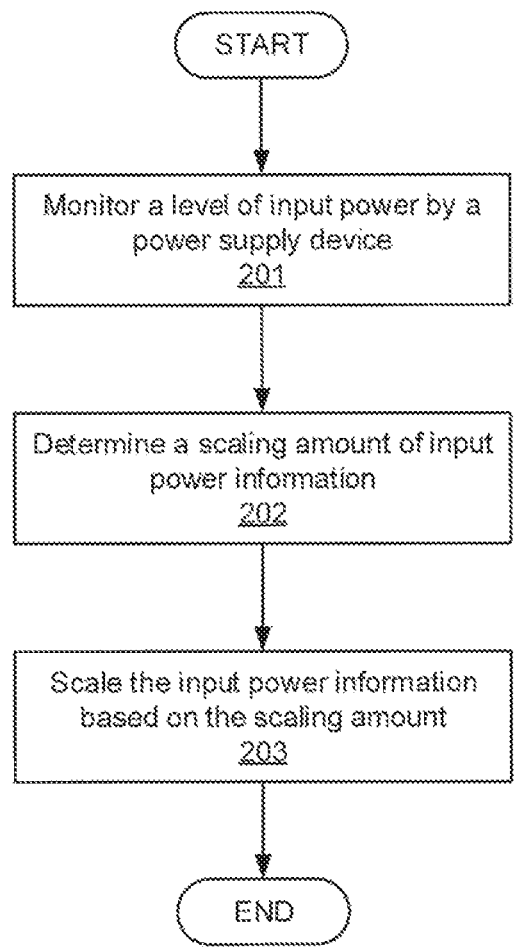
FIG. 2 is a flowchart of a method for input power scaling of power supply devices, according to an example of the principles described herein.

FIG. 2 is a flowchart of a method 200 for input power scaling of power supply devices, according to an example of the principles described herein. According to the method, a level of input power is monitored block 201. Specifically, power supply devices provide input power to a computing device. This input power can be used to allow components of the computing device to carry out their intended function. As is described below, this input power if drawn for too long a period of time can cause damage to the power supply device itself and/or the components that receive it.

Accordingly, within a power management system, the power monitoring device 100 of FIG. 1 provides an output indicative of the amount of input power from a power supply device. The output is scaled from the input power. Specifically, a scaling amount of input power information is determined block 202. In one specific example, an input power may be converted to an input voltage value. In this example, the scaling amount indicates the degree to which the input voltage value is reduced so as to force the output to be within a desired range. The scale by which the input voltage is reduced is such that the power supply device operating at its rated power generates an output voltage at a predetermined voltage value. Any reduction in system or operating power results in a corresponding reduction of the output voltage. In this example, the input voltage value may be an unscaled representation of the input power.

The scaling amount is dependent upon a power supply device power rating. Accordingly, the controller 106 of FIG. 1 receives an indication of the power rating of the power supply device that is coupled to the controller 106 of FIG. 1. With this information, the controller 106 of FIG. 1 determines a scale by which the input power information is reduced to generate an output within a desired range. As described above, such a determination of the scaling amount based on the power supply device rating accommodates a wide variety of ratings of power supply devices.

Once a scaling amount has been determined, the input power information is scaled block 203 based on the scaling amount. That is, a signal is sent from the controller 106 of FIG. 1 to the programmable scaling device 108 of FIG. 1 where the input power information is reduced. In some examples, the programmable scaling device 108 of FIG. 1 is a voltage divider with a fixed resistance device, a variable resistance device, and the output line 104 of FIG. 1 coupled between them. In a voltage divider, changing the tail resistance device affects the output of a line disposed between the resistance devices. The input power information, which may be an input voltage, can be scaled by programming the variable resistance device of the voltage divider. Accordingly, the variable resistance device may be a potentiometer that is set to a particular value as indicated by the controller 106 of FIG. 1. Specifically, the variable resistance device that forms the second resistance device, e.g., the potentiometer, of the voltage divider is set such that an output voltage aligns with the scale determined by the controller 106 of FIG. 1.

In some examples, monitoring block 201 the input power level, determining block 202 a scaling amount, and scaling block 203 the input power information, may occur during a power-on self-test (POST) operation for the computing device. That is, upon booting a computing device, the controller 106 of FIG. 1 executes an operation to determine the rating of the power supply device, and determines a scale based on the indicated rating. If at any time a different power supply device is coupled to the computing device, a reboot, wherein new monitoring block 201, determining block 202, and scaling block 203 operations are carried out, may account for the change of the power supply device.

Figure 3:
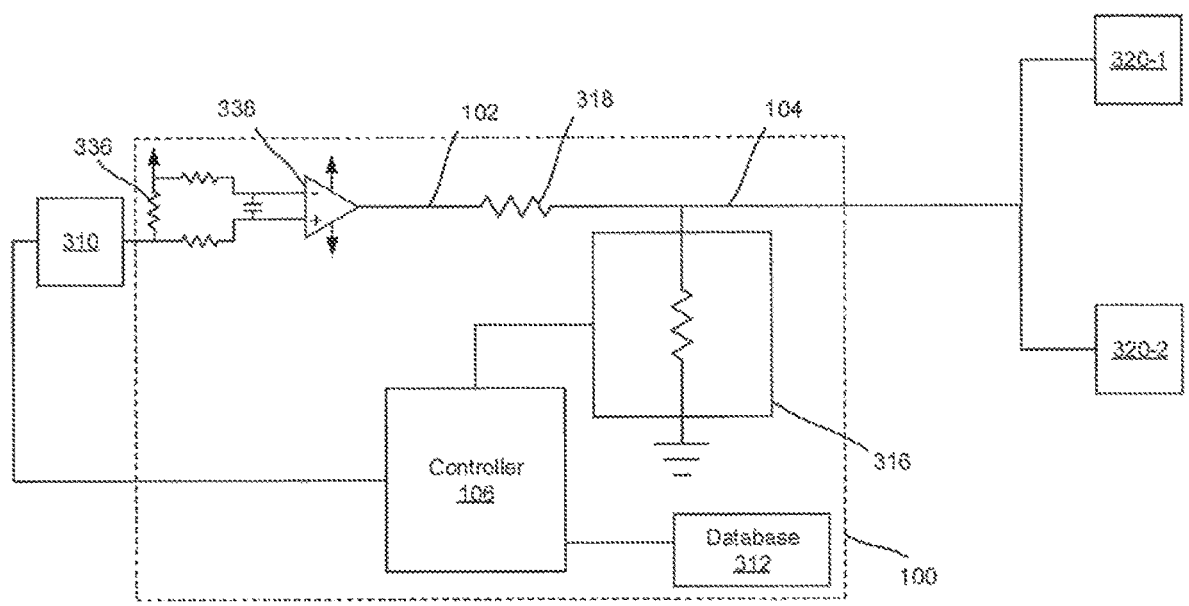
FIG. 3 is a circuit diagram for input power scaling of power supply devices, according to an example of the principles described herein.

FIG. 3 is a circuit diagram for input power scaling of power supply devices 310, according to an example of the principles described herein. In this specific example, the input power information is an input voltage and the output information is an output voltage. As described above, the power monitoring device 100 can accommodate multiple power supply devices 310; however, just one power supply device 310 is supplying power for any given time. As described above, the present device 100 is compatible with different power supply devices 310 at different times throughout its operational life. In this example, the controller 106 receives, from the power supply device 310, an indication of that power supply device rating.

As described above, in some examples, a representation of the input power is converted to an input voltage. In this example, the power monitoring device 100 includes various components to convert the input power to an input voltage. Specifically, the power monitoring device 100 may include a shunt resistor 336. All current supplied by the power supply device 310 passes through the shunt resistor 336 and a voltage drop across the shunt resistor 336 is measured and amplified to generate a voltage representation of the power supplied. That is, the voltage drop across the shunt resistor 336 is passed through an operational amplifier 338 to generate an input voltage representation of the input power.

As a specific numeric example, the shunt resistor 336 may have a resistance of 0.01 Ohms, the operational amplifier 338 may have a gain of 200, and a fixed resistance device 318 having a resistance of 100 kiloohms. Accordingly, if the operational amplifier 338 detects three amps across the shunt resistor 336, then the input voltage would be six volts. The voltage generated by the shunt resistor 336 and operational amplifier 338 is input to the voltage divider of the power monitoring circuit 100.

The controller 106 then determines a mapping between 1) the input voltage and 2) output voltage based on the power supply device 310 rating and a predetermined output voltage value. In some examples, the power-monitoring device 100 further includes a database 312. The database includes these mappings of input power supply device ratings to settings for the variable resistance device. For example, the database may indicate that, when a predetermined output voltage of 2V is desired when the power supply device 310 is operating at its rated 90 W, the variable resistance device within the potentiometer 316 should be set to 27.66 kiloohms.

As another example, the database may indicate that, when a predetermined output voltage of 2V is desired, when a different power supply device 310 is operating at its rated 65 W, the variable resistance device within the potentiometer 316 should be set to 42.86 kiloohms.

As yet another example, the database may indicate that, when a predetermined output voltage of 2V is desired, when yet a different power supply device 310 is operating at its rated 150 W, the variable resistance device within the potentiometer 316 should be set to 14.942 kiloohms. While specific reference is made to particular power ratings and corresponding resistance values, power supply devices 310 with any rating could be used and a plurality of different mappings could be used. While FIG. 3 represents a database 312 that includes a mapping. In some examples, the scaling amount could be calculated, in which case a database 312 would not be used.

An instruction is then sent to the programmable scaling device 108 of FIG. 1, which may be a potentiometer 316 that includes a variable resistance device. The instruction sets the variable resistance device to a resistance value identified by the controller 106. Including such a potentiometer 316 with a variable resistance device accommodates changes to the power supply devices 310 within a computing system, as the variable resistance device within the potentiometer 316 may be set to between 256 and 1,024 resistance values. While specific reference is made to a potentiometer 316 with a specified range of resistance values, different potentiometers 316 may be used which can be set to any range of resistance values.

Returning to the programmable scaling device 108 of FIG. 1. The programmable scaling device 108 of FIG. 1 includes a voltage divider made up of a fixed resistance device 318 having a fixed resistance and a variable resistance device having a variable resistance. As an input voltage is received, which input voltage may be unsealed, it is scaled down at the voltage divider and the scaled version passed along the output line 104 to the recipient devices 320-1, 320-2. The recipient devices 320 may be a variety of types. For example, the devices may be system power monitoring or controlling devices such as a VR controller and/or a super input/output (SIO) device.

As can be seen from FIG. 3, the power monitoring device 100 provides a simple way to indicate the input power from a power supply device 310. This is done by determining the rating of the power supply device 310 and then setting a variable resistance device of a potentiometer 316 to a resistance value commensurate with that rating. An input voltage, i.e., that is produced by the shunt 336/operational amplifier 338 and indicates the input power, is then scaled based on this mapping. Moreover, different power supply devices 310 could be added, and a similar method would be used to account for the change of those power supply devices 310.

Figure 4:
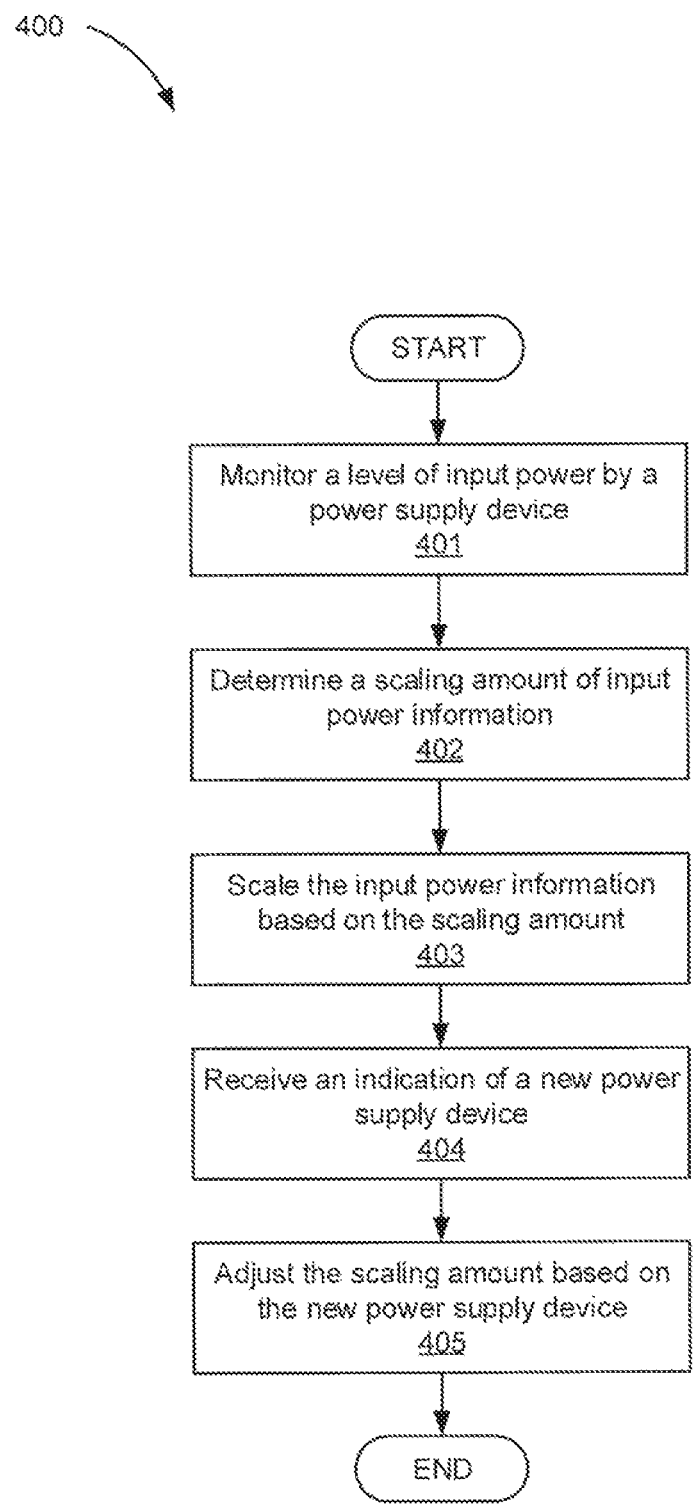
FIG. 4 is a flowchart of a method for input power scaling of power supply devices, according to an example of the principles described herein.

FIG. 4 is a flowchart of a method 400 for input power scaling of power supply devices 310 of FIG. 3, according to an example of the principles described herein. Specifically, as described above, the power monitoring device 100 of FIG. 1 can accommodate the changing of power supply devices 310 of FIG. 3. That is the power supply devices 310 of FIG. 3 may change over an operating life of the computing device. As the power supply device 310 of FIG. 3 is replaced with power supply devices having different ratings, the relationship between input power and output voltage also changes. The present method 400 accommodates for such changes.

According to the method 400, a level of input power is monitored block 401. This may be performed as described above in connection with FIG. 2. A scaling amount may be then be determined block 402 based on this rating. Specifically, the controller 106 of FIG. 1 may determine from a mapping, a resistance value for a variable resistance device in a voltage divider that may yield a desired output r given the particular rating. The input power information is then scaled block 403 based on the scaling amount. This may be performed as described above in connection with FIG. 2.

Then as described above, when there is a change to the power supply device 310 of FIG. 3, an indication may be received block 404 by the controller 106 of FIG. 1 of the change. For example, during a re-boot operation, the controller 106 of FIG. 1 could receive an indication of a different power supply device 310 of FIG. 3 rating. The controller then adjusts block 405 the scaling amount based on the change of power supply device 310 of FIG. 3. Doing so increases the flexibility of a power monitoring device 100 of FIG. 1 as it can accommodate any size, i.e., rating, of power supply devices 310 of FIG. 3.

Figure 5:
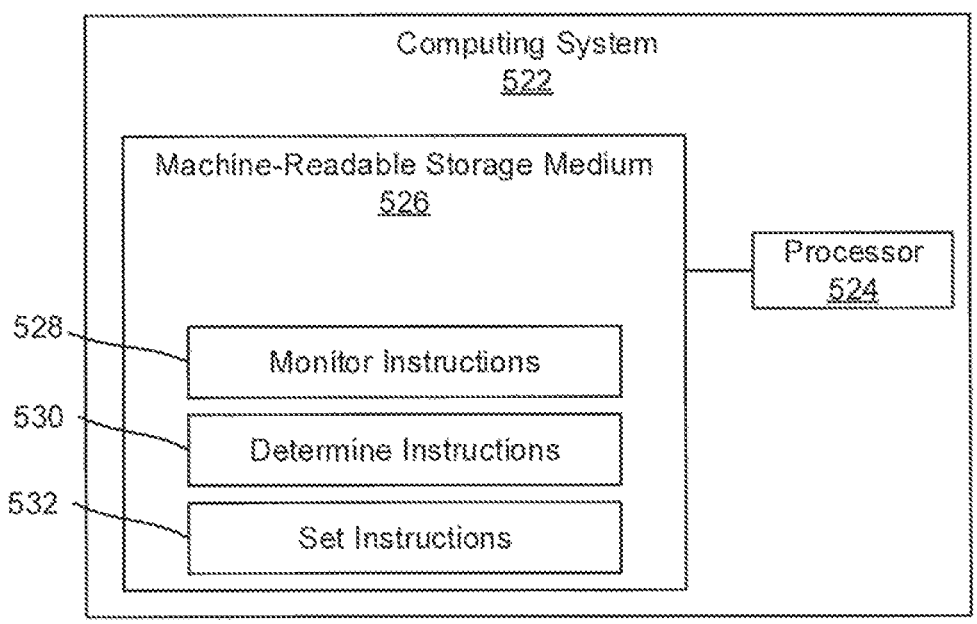
FIG. 5 is a diagram of a computing system for input power scaling of power supply devices, according to an example of the principles described herein.

FIG. 5 is a diagram of a computing system 522 for input power scaling of power supply devices, according to an example of the principles described herein. To achieve its desired functionality, the computing system 522 includes various hardware components. Specifically, the computing system 522 includes a processor 524 and a machine-readable storage medium 526. The machine-readable storage medium 526 is communicatively coupled to the processor 524. The machine-readable storage medium 526 includes a plurality of instruction sets 528, 530, 532 for performing a designated function. The machine-readable storage medium 526 causes the processor 524 to execute the designated function of the instruction sets 528, 530, 532.

Although the following descriptions refer to a single processor 524 and a single machine-readable storage medium 526, the descriptions may also apply to a computing system 522 with multiple processors and multiple machine-readable storage mediums. In such examples, the instruction sets 528, 530, 532 may be distributed (e.g., stored) across multiple machine-readable storage mediums and the instructions may be distributed (e.g., executed by) across multiple processors.

The processor 524 may include at least one processor and other resources used to process programmed instructions. For example, the processor 524 may be a plurality of central processing units CPUs, microprocessors, and/or other hardware devices suitable for retrieval and execution of instructions stored in machine-readable storage medium 526. In the computing system 522 depicted in FIG. 5, the processor 524 may fetch, decode, and execute instructions 528, 530, 532 for scaling input power form power supply devices 310 of FIG. 3. In one example, the processor 524 may include a plurality of electronic circuits comprising a plurality of electronic components for performing the functionality of a plurality of the instructions in the machine-readable storage medium 526. With respect to the executable instruction, representations (e.g., boxes) described and shown herein, it should be understood that part or all of the executable instructions and/or electronic circuits included within one box may, in alternate examples, be included in a different box shown in the figures or in a different box not shown.

The machine-readable storage medium 526 represent generally any memory capable of storing data such as programmed instructions or data structures used by the computing system 522. The machine-readable storage medium 526 includes a machine-readable storage medium that contains machine-readable program code to cause tasks to be executed by the processor 524. The machine-readable storage medium 526 may be tangible and/or non-transitory storage medium. The machine-readable storage medium 526 may be any appropriate storage medium that is not a transmission storage medium. For example, the machine-readable storage medium 526 may be any electronic, magnetic, optical, or other physical storage device that stores executable instructions. Thus, machine-readable storage medium 526 may be, for example, Random Access Memory (RAM), a storage drive, an optical disc, and the like. The machine-readable storage medium 526 may be disposed within the computing system 522, as shown in FIG. 5. In this situation, the executable instructions may be "installed" on the computing system 522. In one example, the machine-readable storage medium 526 may be a portable, external or remote storage medium, for example, that allows the computing system 522 to download the instructions from the portable/external/remote storage medium. In this situation, the executable instructions may be part of an "installation package". As described herein, the machine-readable storage medium 526 may be encoded with executable instructions for scaling input power from power supply devices 310 of FIG. 3.

Referring to FIG. 5, monitor instructions 528, when executed by a processor 524, may cause the computing system 522 to monitor a level of input power supplied by a power supply device 310 of FIG. 3. Determine instructions 530, when executed by a processor 524, may cause the computing system 522 to determine, based on a power rating of the power supply device 310 of FIG. 3, a scaling amount for the input power information to be supplied as output information. Set instructions 532, when executed by a processor 524, may cause the computing system 522 to set a variable resistance device that forms a second resistance device (e.g., the potentiometer 316 of FIG. 3) of a voltage divider based on the scaling amount.

In some examples, the processor 524 and machine-readable storage medium 526 are located within the same physical component, such as a server, or a network component. The machine-readable storage medium 526 may be part of the physical component's main memory, caches, registers, non-volatile memory, or elsewhere in the physical component's memory hierarchy. In one example, the machine-readable storage medium 526 may be in communication with the processor 524 over a network. Thus, computing system 522 may be implemented on a user device, on a server, on a collection of servers, or combinations thereof.

The computing system 522 of FIG. 5 may be part of a general-purpose computer. However, in some examples, the computing system 522 is part of an application specific integrated circuit.

In summary, using such a power monitoring device 1) increases flexibility of the monitoring system by accommodating power supply devices having any rating; 2) accounts for the swapping of power supply devices; 3) reduces part count on a circuit; and 4) reduces circuit complexity. However, it is contemplated that the devices disclosed herein may address other matters and deficiencies in a plurality of technical areas.

The preceding description has been presented to illustrate and describe examples of the principles described. This description is not intended to be exhaustive or to limit these principles to any precise form disclosed. Many modifications and variations are possible in light of the above teaching.

What is claimed is:

1. A power monitoring device comprising:
    an input line to receive input power information from a power supply device, wherein the input power information is indicative of a level of input power from the power supply device;
    a controller to determine a scaling amount of the input power information based on a power rating of the power supply device;
    a programmable scaling device to scale the input power information based on the scaling amount to generate output information; and
    an output line to pass the output information to a set of recipient devices.

2. The device of claim 1, wherein the scaling amount is further determined based on a number of recipient devices in the set of recipient devices.

3. The device of claim 1, wherein the programmable scaling device comprises a voltage divider comprising:
    a fixed resistance device having a fixed resistance;
    a variable resistance device having a variable resistance.

4. The device of claim 3, wherein scaling the input power information comprises setting the variable resistance device to a resistance value that maps to the scaling amount.

5. The device of claim 3, wherein the variable resistance device is a programmable potentiometer that is adjustable to at least 256 resistance values.

6. The device of claim 3, further comprising a database to map the input power information to settings for the variable resistance device.

7. The device of claim 1, wherein the device is compatible with power supply devices having different ratings.

8. The device of claim 1, wherein the set of recipient devices to which the output information is passed comprise system power controlling devices.

9. A method comprising:
    monitoring, a level of input power supplied by a power supply device;
    determining, based on a power rating of the power supply device, a scaling amount of input power information to be supplied as output information, wherein the input power information is indicative of the level of input power; and
    scaling the input power information based on a determined scaling amount by programming a variable resistance device that forms a second resistance device of a voltage divider, wherein a first resistance device of the voltage divider has a fixed resistance.

10. The method of claim 9, further comprising:
receiving an indication of a change to the power supply device; and
adjusting the scaling amount based on the change.

11. The method of claim 9, wherein determining a scaling amount of the input power information comprises determining a mapping of the power supply rating to a resistance value of the variable resistance device.

12. The method of claim 9, wherein monitoring, determining, and scaling occur during a power-on self-test (POST) for a computing device.

13. A computing system comprising:
a processor;
a machine-readable storage medium coupled to the processor; and
an instruction set, the instruction set being stored in the machine-readable storage medium to be executed by the processor, wherein the instruction set comprises:
instructions to monitor a level of input power supplied by a power supply device;
instructions to determine, based on a power rating of the power supply device, a scaling amount of input power information to be supplied as output information, wherein the input power information is indicative of the level of input power; and
instructions to set a variable resistance device that forms a second resistance device of a voltage divider based on the scaling amount, wherein a first resistance device of the voltage divider has a fixed resistance.

14. The computing system of claim 13, further comprising instructions to output the output information to a voltage regulator controller, a super input/output, or combinations thereof.

15. The computing system of claim 13, further comprising instructions to convert the input power information from a current to a voltage.

* * * * *